(12) United States Patent
Fish et al.

(10) Patent No.: US 7,791,565 B2
(45) Date of Patent: Sep. 7, 2010

(54) COLOUR ELECTROLUMINESCENT DISPLAY DEVICE AND ITS DRIVING METHOD

(75) Inventors: David A. Fish, Haywards Heath (GB); Mark J. Childs, Swindon (GB); Nijs C. Van Der Vaart, Rosmalen (NL); Jurgen J. L. Hoppenbrouwers, Eindhoven (NL); Roel Van Woudenberg, Eindhoven (NL); Franciscus P. M. Budzelaar, Eindhoven (NL)

(73) Assignee: TPO Hong Kong Holding Limited (HK)

( * ) Notice: Subject to any disclaimer, the term of this patent is extended or adjusted under 35 U.S.C. 154(b) by 782 days.

(21) Appl. No.: 10/599,867

(22) PCT Filed: Apr. 15, 2005

(86) PCT No.: PCT/IB2005/051233
§ 371 (c)(1),
(2), (4) Date: Oct. 12, 2006

(87) PCT Pub. No.: WO2005/101513
PCT Pub. Date: Oct. 27, 2005

(65) Prior Publication Data
US 2007/0222800 A1  Sep. 27, 2007

(30) Foreign Application Priority Data
Apr. 16, 2004  (GB) .................................. 0408486.9

(51) Int. Cl.
*G09G 3/30* (2006.01)
*G09G 3/10* (2006.01)
(52) U.S. Cl. ...................................... 345/76; 315/169.3
(58) Field of Classification Search .................... 345/76; 315/169.3
See application file for complete search history.

(56) References Cited

U.S. PATENT DOCUMENTS 6,262,710 B1 * 7/2001 Smith .......................... 345/589

(Continued)

FOREIGN PATENT DOCUMENTS

| EP | 0367848 A1 | 5/1990 |
| EP | 0717446 A2 | 6/1996 |

(Continued)

OTHER PUBLICATIONS

S.K. Heeks et al; "Light Emitting Polymers for Full Colour Display Applications", ISSN/0001-0966X/01/3201-0518, SID 01 Digest, Cambridge Display TEC, Greenwich House, Cambridge, UK.

*Primary Examiner*—Amr Awad
*Assistant Examiner*—Jonathan Boyd
(74) *Attorney, Agent, or Firm*—Lowe Hauptman Ham & Berner, LLP (57) ABSTRACT

A color electroluminescent, EL, display device comprising an array of pixels (11) each comprising sub-pixels (1) of two or more colors (R, G, B). For at least one of the colors (R, G, B), the pixel (11) comprises a first sub-pixel ($R_L$, $G_L$, $B_L$) comprising a first EL material and a second sub-pixel ($R_c$, $G_c$, $B_c$) comprising a second EL material. The first EL material is of higher lifetime than the second EL material; the second EL material has better color points and/or better color rendition properties than the first EL material. In some embodiments a pixel comprises two red sub-pixels ($R_L$, $R_c$), two green sub-pixels ($G_L$, $G_c$) and two blue sub-pixels (BL, Bc), one sub-pixel of each color ($R_L$, $G_L$, $B_L$) comprising relatively high lifetime EL material and the other sub pixel of each color ($R_c$, $G_c$, $B_c$) comprising relatively good color points EL material. In other embodiments a pixel comprises two blue sub-pixels ($B_L$, $B_c$) but only one red sub-pixel and one green sub-pixel.

12 Claims, 4 Drawing Sheets

U.S. PATENT DOCUMENTS

| | | | |
|---|---|---|---|
| 6,388,644 B1 * | 5/2002 | De Zwart et al. | 345/60 |
| 6,570,584 B1 * | 5/2003 | Cok et al. | 345/690 |
| 6,747,618 B2 * | 6/2004 | Arnold et al. | 345/77 |
| 6,911,961 B2 * | 6/2005 | Miller et al. | 345/82 |
| 2003/0011613 A1 * | 1/2003 | Booth, Jr. | 345/589 |
| 2003/0098828 A1 | 5/2003 | Hunter et al. | |
| 2004/0178974 A1 * | 9/2004 | Miller et al. | 345/82 |

FOREIGN PATENT DOCUMENTS

| | | |
|---|---|---|
| JP | 2000235891 | 8/2000 |
| WO | 200011728 | 3/2000 |
| WO | 200106576 A1 | 1/2001 |
| WO | 200195544 A2 | 12/2001 |
| WO | 200199195 A1 | 12/2001 |
| WO | 2004036535 A1 | 4/2004 |
| WO | 2004061963 A1 | 7/2004 |

* cited by examiner

COLOUR ELECTROLUMINESCENT DISPLAY DEVICE AND ITS DRIVING METHOD

The present invention relates to colour electroluminescent display devices, for example using organic light emitting diode (LED) devices such as polymer LEDs (PLEDs).

Matrix display devices employing electroluminescent (EL), light-emitting display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer. The polymer material can be fabricated simply by a spin coating technique using a solution of a soluble conjugated polymer.

Organic electroluminescent materials exhibit diode-like I-V properties, so that they are capable of providing both a display function and a switching function, and can therefore be used in passive type displays. Alternatively, these materials may be used for active matrix display devices, with each pixel comprising a display element and a switching device for controlling the current through the display element.

Some display devices of this type have current-addressed display elements, and use a conventional, analogue drive scheme involving supplying a controllable current to the display element. It is known to provide a current source transistor as part of the pixel configuration, with the gate voltage supplied to the current source transistor determining the current through the display element. A storage capacitor holds the gate voltage after the addressing phase. Grey scale levels are achieved in the analogue drive scheme by virtue of the grey scale level being determined by the analogue drive current level.

Digital drive schemes have also been proposed. In such schemes, the LED device is effectively driven to two possible voltage levels. One known way of providing grey scale levels with a digital drive scheme is that pixels can be turned on and off more quickly than the frame rate, so that a grey scale is implemented as function of the duty cycle with which the pixel is turned on. This may be referred to as a time ratio method.

US 2003/0098828 A1 discloses an EL display device which is operable in both analogue mode and digital mode.

Colour electroluminescent display devices employ different EL materials to provide respective colour sub-pixels together providing a colour pixel. The sub-pixels are usually red, green and blue; i.e. their transmission wavelengths are respectively a red wavelength, a green wavelength and a blue wavelength. Particular colours and hues of colours, are displayed by the pixel by driving each respective colour sub-pixel at its own "grey level". This provides a combined light output that contains a required weighted mixture of the three sub-pixel colour transmission wavelengths.

The accuracy of colour rendition available from such a display depends in part upon how good the colour points of the EL materials are, i.e. how much of a contribution to providing the overall colour spectrum each can provide. Generally, EL materials with good colour points, i.e. colour depth, are available, but these materials do not tend to have as high lifetime as other available EL materials with less good colour points.

JP 2000235891 discloses an organic EL device with reportedly good colour balance and lifetime. The light emitting areas of the different colours are of differing sizes.

Unrelated to colour issues, WO 0106576 discloses a PLED that has a long life and improved efficiency and radiance due to making the cathode multi-layered.

WO 0199195 discloses a light-emitting device comprising two different EL materials, each one providing a completely different respective colour (e.g. blue and red). The EL material with the shorter lifetime is driven at a lower brightness than the other EL material with the aim of making the shorter lifetime material last as long as the other EL material.

The present inventors have realised it would be desirable to improve the lifetime of a colour electroluminescent display device providing relatively acceptable or relatively accurate colour rendition.

In a first aspect, the present invention provides a colour electroluminescent, EL, display device comprising an array of pixels; wherein: each pixel comprises sub-pixels of two or more main colours; for at least one of the main colours, the pixels comprise a first sub-pixel of the main colour comprising a first EL material and a second sub-pixel of the main colour comprising a second EL material; the first EL material is of a higher lifetime than the second EL material; and the second EL material has a better colour point and/or better colour rendition properties than the first EL material.

Each pixel may comprise a said first sub-pixel of the one or each respective at least one main colour comprising a first EL material and a said second sub-pixel of the one or each respective at least one main colour comprising a second EL material.

The display device may further comprise circuitry arranged to drive the display device such that when a colour or colour hue to be displayed by the pixel can be provided with a sufficient colour contribution of the main colour of the first and second sub-pixels by driving the first sub-pixel without driving the second sub-pixel, then the first sub-pixel is driven but not the second sub-pixel; and further arranged such that when the colour or colour hue to be displayed cannot be provided with a sufficient colour contribution of the main colour of the first and second sub-pixels by driving the first sub-pixel without driving the second sub-pixel, then the second sub-pixel is driven.

The driving circuitry may be arranged such that, when the colour or colour hue to be displayed cannot be provided with a sufficient colour contribution of the main colour of the first and second sub-pixels by driving the first sub-pixel without driving the second sub-pixel, then the second sub-pixel is driven in addition to driving the first sub-pixel.

The driving circuitry may be arranged such that, when the colour or colour hue to be displayed cannot be provided with a sufficient colour contribution of the main colour of the first and second sub-pixels by driving the first sub-pixel without driving the second sub-pixel, then the second sub-pixel is driven instead of driving the first sub-pixel.

The display device may be such that, for each of the main colours, the pixel comprises a first sub-pixel comprising a first EL material and a second sub-pixel comprising a second EL material; the first EL material is of a higher lifetime than the second EL material; and the second EL material has better colour points and/or better colour rendition properties than the first EL material.

The main colours may be red, green and blue.

The display device may comprise three differently coloured sub-pixels of a relatively high lifetime EL material arranged in a first row (e.g. in the main colours R, G and B, and e.g. in positional order $R_L$-$G_L$-$B_L$); and a further three differently coloured sub-pixels of the same main colours (in the case of the previous example in parentheses, R, G, B) of a relatively good colour EL material arranged in a second row directly under the first row. These three sub-pixels may be arranged in a corresponding positional colour order (i.e. in the case of the previous example in parentheses, $R_C$-$G_C$-$B_C$).

The display device may comprise differently coloured sub-pixels for only the main colour of blue.

In a further aspect, the present invention provides a method of driving a colour electroluminescent, EL, display device, comprising: determining whether a sufficient colour contribution to a colour hue to be displayed can be provided by a first sub-pixel of a pair of colour sub-pixels of a given colour, wherein the first sub-pixel of the pair comprises a first EL material and the second sub-pixel of the pair comprises a second EL material, the first EL material being of a higher lifetime than the second EL material, and the second EL material having better colour points and/or better colour rendition properties than the first EL material; if a sufficient colour contribution can be provided, driving the first sub-pixel but not the second sub-pixel; and if a sufficient colour contribution cannot be provided, driving the second sub-pixel.

One possibility is that, if a sufficient colour cannot be provided, the step of driving the second sub-pixel is performed in addition to driving the first sub-pixel such that both the first and second sub-pixel make a colour contribution to the colour hue to be displayed.

Another possibility is that, if a sufficient colour cannot be provided, the step of driving the second sub-pixel is performed instead of driving the first sub-pixel such that the second sub-pixel makes a colour contribution to the colour hue to be displayed but the first sub-pixel does not make a contribution to the colour hue to be displayed.

In a further aspect, a pixel may comprise two red sub-pixels, two green sub-pixels and two blue sub-pixels; one sub-pixel of each colour comprising relatively high lifetime EL material and the other sub-pixel of each colour comprising relatively good colour points EL material. Where possible, colours are displayed using only the high lifetime sub-pixels, hence providing good lifetime, but for certain colours requiring stronger colour points the good colour sub-pixels are driven instead or in addition to the high lifetime sub-pixels.

Thus colour rendition or reproduction tends to be improved by use of the good colour EL material whilst tending to obtain better lifetime performance, due to the use of the relatively better lifetime EL materials, than would be the case if only the good colour EL materials were used.

Embodiments of the present invention will now be described, by way of example, with reference to the accompanying drawings, in which.

Figure 1:
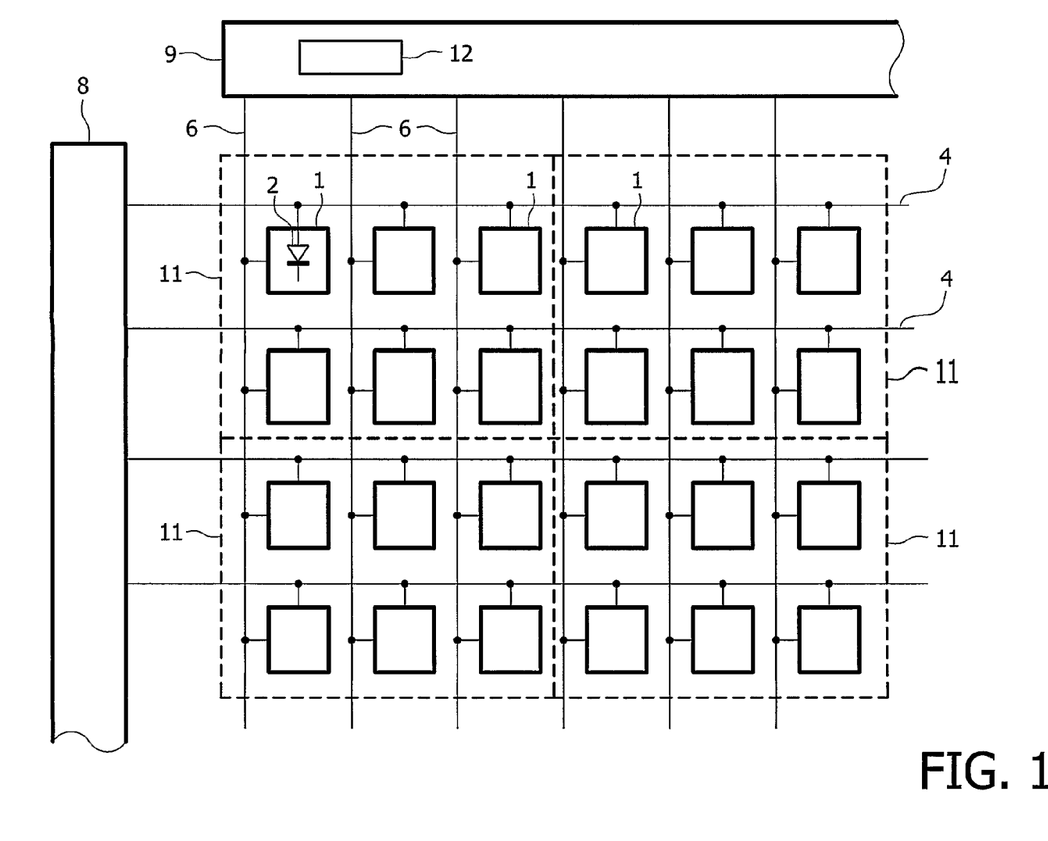
FIG. 1 a schematic illustration of part of an active matrix addressed colour electroluminescent display device.

FIG. 1 is a schematic illustration of part of an active matrix addressed colour electroluminescent display device according to the first embodiment. The active matrix addressed electroluminescent display device comprises a panel having a row and column matrix array of regularly-spaced sub-pixels, denoted by the blocks 1 and comprising electroluminescent display elements 2 together with associated switching means. The sub-pixels 1 are located at the intersections between crossing sets of row (selection) and column (data) address conductors 4 and 6. Respective groups of six sub-pixels 1, arranged in two rows of three columns, provide a respective pixel 11. Only a few pixels 11 are shown in the Figure for simplicity. In practice there may be several hundred rows and columns of pixels 11. The sub-pixels 1 are addressed via the sets of row and column address conductors by a peripheral drive circuit comprising a row, scanning, driver circuit 8 and a column, data, driver circuit 9 connected to the ends of the respective sets of conductors. The column driver circuit 9 comprises a colour module 12, which will be described in more detail later below.

The electroluminescent display element 2 comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. The support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support. Typically, the thickness of the organic electroluminescent material layer is between 100 nm and 200 nm.

In this embodiment different organic electroluminescent materials or conjugated polymer materials are used for different sub-pixels 1 in a pixel 11, as will be described in more detail below.

Figure 2:
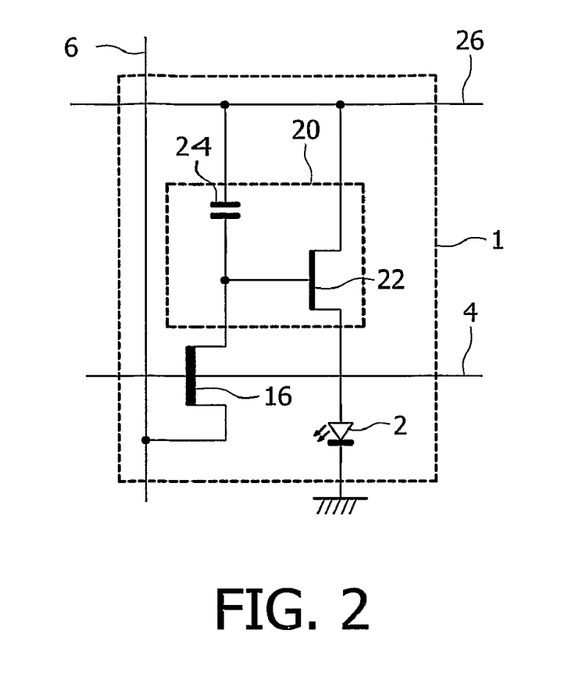
FIG. 2 shows in simplified schematic form a sub-pixel and drive circuitry arrangement used for each sub-pixel of the display device of FIG. 1.

FIG. 2 shows in simplified schematic form a sub-pixel and drive circuitry arrangement used for each sub-pixel 1 in this embodiment. Each sub-pixel 1 comprises the EL display element 2 and associated driver circuitry. The driver circuitry has an address transistor 16 which is turned on by a row address pulse on the row conductor 4. When the address transistor 16 is turned on, a voltage on the column conductor 6 can pass to the remainder of the sub-pixel. In particular, the address transistor 16 supplies the column conductor voltage to a current source 20, which comprises a drive transistor 22 and a storage capacitor 24. The column voltage is provided to the gate of the drive transistor 22, and the gate is held at this voltage by the storage capacitor 24 even after the row address pulse has ended.

In this embodiment the sub-pixel and drive circuitry arrangement is operated in an analogue mode. The range of the gate voltages on the drive transistor 22 in combination with the voltage on the power rail 26 supplying the current source 20 are selected such that the transistor is operating in the saturation region, so that the source-drain current is approximately quadratic to the gate voltage. Thus, the voltage on the column conductor 6 is used to select a desired current flow to the display element 2. Typically around 6V will be dropped across the source-drain of the drive transistor 22, and as a result, the voltage on the power rail 26 will need to be around 10V so that a required voltage drop across the LED of around 4V is achieved (when the cathode is grounded as shown). Typical gate voltages will be in a range with a stored voltage on the storage capacitor 24 of around 4V. For example, the data signal on the column conductor 6 may fall within a range of around 5-7V.

Figure 3:
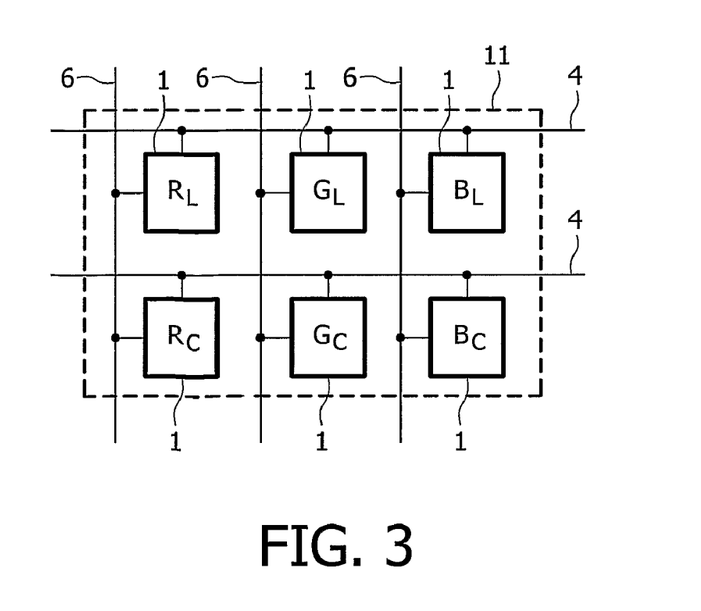
FIG. 3 is a schematic illustration showing further details of a pixel of the display device of FIG. 1.

FIG. 3 is a schematic illustration showing further details of a pixel 11. In this embodiment, three colours of sub-pixels are provided, i.e. red, green and blue, indicated respectively as R, G and B in FIG. 3. For each of these three colours, i.e. main colours of the display, two separate sub-pixels 1 are provided, i.e. there are two red sub-pixels, two green sub-pixels and two blue sub-pixels in each pixel 11.

For each main colour, the two-sub-pixels 1 of that colour in the pixel 11 are each formed from a different EL material. In more detail, one of the two sub-pixels of a given main colour is formed from an EL material with a relatively poor colour point (i.e. a relatively low saturation i.e. depth of the colour, i.e. relatively poor colour rendition properties) but relatively high lifetime (hereinafter referred to as a high lifetime EL material), whereas the other of the two sub-pixels of the given colour is formed from an EL material with a relatively good colour point (i.e. a relatively high saturation i.e. depth of the colour, i.e. relatively good colour rendition properties) but relatively low lifetime (hereinafter referred to as a good colour EL material).

Thus, referring to FIG. 3, each pixel comprises a respective sub-pixel 1 of each of the three colours in a high lifetime EL material, indicated in FIG. 3 as $R_L$, $G_L$ and $B_L$, and a further respective sub-pixel 1 of each of the three colours in a good colour EL material, indicated in FIG. 3 as $R_C$, $G_C$ and $B_C$.

In this embodiment, the three differently coloured sub-pixels 1 of the high lifetime EL material are arranged in a first row in the order, form left to right as seen in FIG. 3, $R_L$-$G_L$-$B_L$, and the three differently coloured sub-pixels 1 of the good colour EL material are arranged in a second row directly under the first row, in a corresponding colour order, i.e. from left to right as seen in FIG. 3, $R_C$-$G_C$-$B_C$. Thus, in this embodiment, each column of sub-pixels is formed of one basic colour (e.g. red), and in each such column the sub-pixels alternate between a high lifetime EL material of the colour and a good colour EL material of that colour. This also means that all the sub-pixels 1 connected to a given column conductor 6 are of the same basic colour (e.g. red).

Further the above described arrangement of the sub-pixels 1 enables each sub-pixel 1 to be driven independently.

In operation, different sub-pixels 1 within a pixel are driven according to the colour information to be displayed by the pixel. Roughly speaking, a given colour or colour hue is displayed by a pixel 11 by using only one, two or all three of the respective colour high lifetime EL material sub-pixels $R_L$, $G_L$ and $B_L$, where this allows the colour to be sufficiently accurately provided. However, when the given colour to be displayed is such that the high lifetime EL material sub-pixels $R_L$, $G_L$ and $B_L$ are not able in combination to provide sufficiently accurate colour rendition, (i.e. the colour hue to be displayed by the pixel cannot be provided with a sufficient colour contribution of the respective main colours R, G and B by driving those main colours' respective high lifetime sub-pixels $R_L$, $G_L$ and $B_L$) then one or more of the good colour EL material sub-pixels $R_C$, $G_C$ and $B_C$ are driven to enable them to better contribute to providing the required given colour by virtue of their relatively better colour points.

In general there are a number of possible ways (i.e. schemes) by which operation of one or more of the good colour EL material sub-pixels $R_C$, $G_C$ and $B_C$ can be combined with operation of one or more of the high lifetime EL material sub-pixels $R_L$, $G_L$ and $B_L$. Examples of these will be described below, with reference to FIG. 4.

Figure 4:
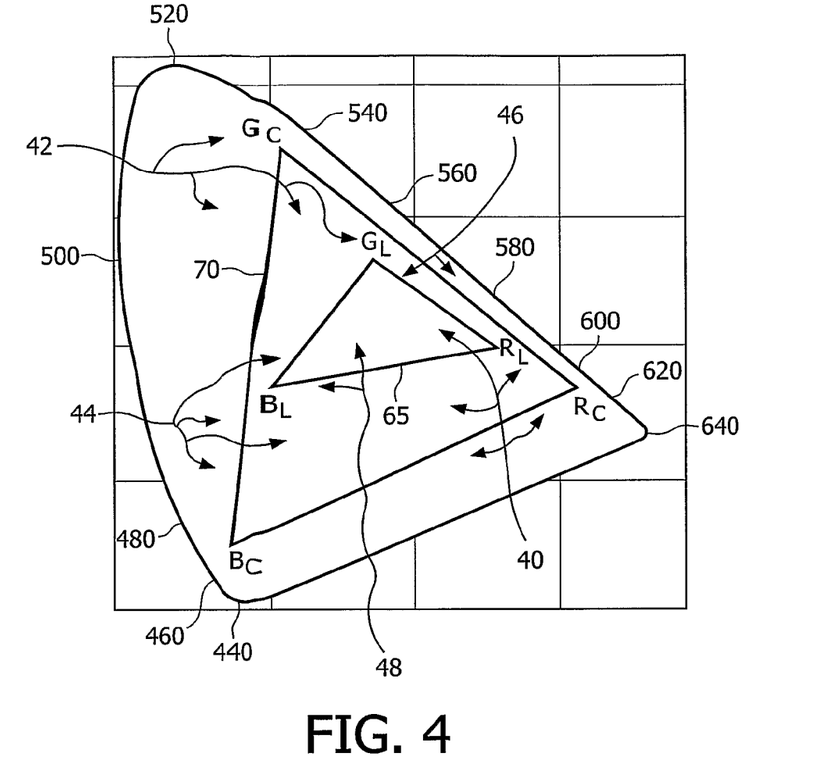
FIG. 4 is a colour palette diagram.

FIG. 4 is a colour palette diagram. Such diagrams are usually shown in colour, and are well known to the skilled person. The values 440, 460, 480, 500, 520, 540, 560, 580, 600, 620 and 640 shown around the edge of the palette shape indicate light wavelength values in nanometres, e.g. 440 indicates light of wavelength 440 nm, and so on. The skilled person will readily appreciate that, as is visually apparent when the palette is shown in normal colour print, the approximate area indicated by reference numeral 40 shows and indicates red, the approximate area indicated by reference numeral 42 shows and indicates green, and the approximate area indicated by reference numeral 44 shows and indicates blue. Each of these areas blends into adjoining areas so as to show and represent all colour mixes and hues, for example the approximate area indicated by reference numeral 46 shows and indicates yellow and orange hues. Furthermore, in the effective centre, an approximate area indicated by reference numeral 48 shows and indicates white "colour".

The range of colour hues that are able to be displayed by a combination of a given red, green and blue sub-pixel may be represented by, or considered in terms of, a triangle drawn on the colour palette. Referring to FIG. 4, a first triangle 65 is specified by the three corners thereof which are the respective colour points for the EL material of the high lifetime EL material sub-pixels $R_L$, $G_L$ and $B_L$. The first triangle 65 represents the range of colour hues that can be produced by driving one, two or all three of the high lifetime EL material sub-pixels $R_L$, $G_L$ and $B_L$ described above. These colour hues are referred to below as being colours lying within the first triangle 65. In other words, the respective high lifetime EL material sub-pixels $R_L$, $G_L$ and $B_L$ are able to provide a sufficient colour contribution to colours or colour hues lying within the first triangle 65.

FIG. 4 also shows a second triangle 70 which is specified by the three corners thereof which are the respective colour points for the EL material of the good colour EL material sub-pixels $R_C$, $G_C$ and $B_C$. Thus the second triangle 70 represents the range of colour hues that can be produced by driving one, two or all three of the good colour EL material sub-pixels $R_C$, $G_C$ and $B_C$ described above. These colour hues are referred to below as being colours lying within the second triangle 70.

The first triangle 65 is of smaller area than the second triangle 70, since the range or extent of colours that can be provided by the high lifetime EL material sub-pixels $R_L$, $G_L$ and $B_L$ is less than that which can be provided by the good colour EL material sub-pixels $R_C$, $G_C$ and $B_C$.

Both the first triangle 65 and the second triangle 70 are shown schematically/qualitatively in FIG. 4 for clarity, and do not necessarily correspond in detail of shape, size or location on the colour palette to the triangles that are characteristic of particular known materials.

In this embodiment the operating scheme is as follows (N.B. for the purpose of distinguishing this scheme from other possible schemes described below, this operating scheme will be referred to below as the first operating scheme):

1a) When the colour or colour hue to be displayed by the pixel 11 is within the first triangle 65, only the high lifetime EL material sub-pixels $R_L$, $G_L$ and $B_L$ are driven. More particularly, depending on the detail of the colour or colour hue falling within the first triangle 65 that is to be displayed, either one, two or all three of the differently coloured high lifetime EL material sub-pixels $R_L$, $G_L$ and $B_L$ are driven.

1b) When the colour or colour hue to be displayed by the pixel 11 is outside the first triangle 65, the high lifetime EL material sub-pixels $R_L$, GL and $B_L$ are driven, and in addition, one or more of the good colour EL material sub-pixels $R_C$, $G_C$ and $B_C$ are driven. More particularly, depending on the detail of the colour or colour hue falling outside the first triangle 65 that is to be displayed, either one, two or all three of the differently coloured high lifetime EL material sub-pixels $R_L$, $G_L$ and $B_L$ are driven, and in addition, either one, two or all three of the differently coloured good colour EL material sub-pixels $R_C$, $G_C$ and $B_C$ are driven. Thus, for colours or colour hues outside the first triangle 65, the additional colour rendering possible by virtue of using the good colour EL material sub-pixels $R_C$, $G_C$ and $B_C$ is in effect added to the basic, but insufficient, colour rendering provided by the high lifetime EL material sub-pixels $R_L$, $G_L$ and $B_L$. This particular "additive" approach provides improved colour rendition whilst enabling as extensive as possible use of the high lifetime EL material sub-pixels $R_L$, $G_L$ and $B_L$ compared to the good colour EL material sub-pixels $R_C$, $G_C$ and $B_C$. In particular, by driving the high lifetime EL material sub-pixels $R_L$, $G_L$ and $B_L$ to provide a kind of "colour base" even though the good colour EL material sub-pixels $R_C$, $G_C$ and $B_C$ are being driven for better colour, the brightness level at which the good colour EL material sub-pixels $R_C$, $G_C$ and $B_C$ need be driven is reduced. This may cause a slight reduction in the absolute accuracy of the colour rendition, but this will often be small compared to the improvement achieved by the use of the good colour EL material sub-pixels $R_C$, $G_C$ and $B_C$, and will in many cases represent a trade-off worth paying for the sake of even further improved lifetime performance.

It is also noted that when the colour or colour hue to be displayed by the pixel 11 is outside even the second triangle 70, even the use of the good colour EL material sub-pixels $R_C$, $G_C$ and $B_C$ will not provide fully accurate colour rendition. Nevertheless, the colours that will be provided will be closer to what would ideally be provided than would be the case if only the high lifetime EL material sub-pixels $R_L$, $G_L$ and $B_L$ had been used.

As mentioned above, many different operating schemes may be contemplated. An example of a second operating scheme that may be employed is as follows:

2a) When the colour or colour hue to be displayed by the pixel 11 is within the first triangle 65, only the high lifetime EL material sub-pixels $R_L$, $G_L$ and $B_L$ are driven. More particularly, depending on the detail of the colour or colour hue falling within the first triangle 65 that is to be displayed, either one, two or all three of the differently coloured high lifetime EL material sub-pixels $R_L$, $G_L$ and $B_L$ are driven.

2b) When the colour or colour hue to be displayed by the pixel 11 is outside the first triangle 65, none of the high lifetime EL material sub-pixels $R_L$, $G_L$ and $B_L$ are driven. Instead, one or more of the good colour EL material sub-pixels $R_C$, $G_C$ and $B_C$ are driven. More particularly, depending on the detail of the colour or colour hue falling outside the first triangle 65 that is to be displayed, either one, two or all three of the differently coloured good colour EL material sub-pixels $R_C$, $G_C$ and $B_C$ are driven, but none of the high lifetime EL material sub-pixels $R_L$, $G_L$ and $B_L$ are driven. Thus, for colours or colour hues outside the first triangle 65, improved colour rendering is provided by virtue of using the good colour EL material sub-pixels $R_C$, $G_C$ and $B_C$ instead of the inadequate (in terms of colour rendition for the given colour or hue to be displayed) high lifetime EL material sub-pixels $R_L$, $G_L$ and $B_L$. This particular "substitution" approach provides the best possible improvement in colour rendition that may be provided by having available for use the good colour EL material sub-pixels $R_C$, $G_C$ and $B_C$. However, compared to the "additive" first driving scheme described above, this optimisation of the colour improvement is at the expense of a trade-off with the aspect that the brightness level at which the good colour EL material sub-pixels $R_C$, $G_C$ and $B_C$ need to be driven is higher hence accelerating degradation of these relatively low lifetime materials.

An example of a third operating scheme that may be employed is as follows:

3a) When the colour or colour hue to be displayed by the pixel 11 is within the first triangle 65, only the high lifetime EL material sub-pixels $R_L$, $G_L$ and $B_L$ are driven. More particularly, depending on the detail of the colour or colour hue falling within the first triangle 65 that is to be displayed, either one, two or all three of the differently coloured high lifetime EL material sub-pixels $R_L$, $G_L$ and $B_L$ are driven.

3b) When the colour or colour hue to be displayed by the pixel 11 is outside the first triangle 65, then, for one or more of the three colours red, green, blue, the good colour EL material sub-pixel of that colour or colours is driven instead of the high lifetime EL material sub-pixel of that colour or colours. For example, the high lifetime EL material sub-pixels $R_L$ and $G_L$ may be driven in the case of the colours red and green (but not the good colour EL material sub-pixels $R_C$ and $G_C$), with the good colour EL material sub-pixel $B_C$ being driven in the case of the colour blue (but not the high lifetime EL material sub-pixel $B_L$). This may be arranged to occur, say, when the colour to be displayed is in the blue area of the second triangle 70. This particular "colour-by-colour" approach potentially provides economic use of the good colour EL material sub-pixels $R_C$, $G_C$ and $B_C$, but requires extra processing.

A further possibility is to provide a combination of the above schemes, where the approach to be implemented effectively depends upon where the colour to be displayed lies on the colour palette compared to the location of the first triangle 65 and the second triangle 70. For example, the "additive" approach of the first scheme above could be employed for the colours lying outside the first triangle 65 but within the second triangle 70 except for those colours lying just a little distance (i.e. less than a predetermined distance) outside the first triangle 65, for which the "substitution" approach of the second scheme could be employed instead.

As is clear from the above, different combinations of sub-pixels 1 are driven according to the colour to be displayed by the pixel 11. The determination of which pixels are to be driven for a given colour to be displayed may be implemented at various different parts of an overall display device or arrangement, and/or in various ways.

In this embodiment, this is implemented by the colour module 12 of the column driver circuit 9. Data signals input to the column driver circuit 9 are processed by the colour module 12 to determine the colour to be displayed for each pixel in each frame. For each pixel data of a frame the colour module 12 compares the colour to be displayed with the colour displaying capabilities of the EL materials. In this embodiment this is implemented using a look-up table effectively containing a digitized form of the colour palette/triangle information shown graphically in FIG. 4. In other words, the colour module 12 determines whether the colour point of the colour to be displayed lies inside the first triangle 65. Also, if the operating scheme is one that requires knowledge of whether the colour to be displayed lies within the second triangle 70, then this is also determined.

Then the data signals are applied to the respective column conductors 6 at the required time relative to the scanning of the row conductors 4 so that the correct sub-pixels 1 in each pixel 11 are driven to implement the possibilities 1a) and 1b) as required according to the first operating scheme described above.

Another possibility is that the colour module 12 is separate from the column driver circuit 9, but nevertheless is still part of the active matrix addressed EL display device. In this case the colour module 12 performs a form of pre-processing of received data signals before they are passed to the column driver circuit 9. In this case the colour module 12 compares the colour to be displayed for each pixel according to the received data signal, and determines for each one which sub-pixels will need to be driven. The colour module 12 then effectively converts this information to take account of the alternating rows of high lifetime EL material sub-pixels $R_L$, $G_L$ and $B_L$ and good colour EL material sub-pixels $R_C$, $G_C$ and $B_C$ to provide a revised data input signal which may be fed to the column driver circuit 9. In this case, the column data driver circuit 9 may be a conventional column driver circuit 9, i.e. in effect, with this pre-processing approach, the column driver circuit 9 "does not need to know" that alternate lines of data are in fact for different types of sub-pixels.

A further possibility is for the data signal to have been adapted to the sub-pixel and row/column arrangement of the display device prior to input to the active matrix addressed EL display device. In other words there is no requirement then for a colour module 12 to form part of the active matrix addressed EL display device. Instead, the data received by the device is already in a format that accommodates the two types of sub-pixels present in the device of this embodiment.

The skilled person may contemplate the use of a wide range of EL materials as possible materials for the sub-pixels, as follows. EL materials that are known in an absolute sense to be either of good lifetime with poor colour rendition, or good colour rendition with poor lifetime, are straightforward to select.

In general, the skilled person can readily assess the possibility of using any EL materials that are available or become available, by comparing the lifetime characteristics and colour point properties of such materials. Such details may be available in published data, or derivable by calculation, interpolation, estimation etc. from published data, relating to a material under consideration or relating to one or more materials similar to a material under consideration. If, say, insufficient lifetime and/or colour property information is available from published data, then the skilled person can, for example, purchase or develop materials, then measure them in a systematic and routine manner corresponding to trial and error to determine the required relative lifetime and colour characteristics. These measurements may be performed such as to obtain results in either an absolute sense or in a relative sense between different candidate materials.

Furthermore, even EL materials considered in an absolute sense to be relatively poor in terms of both lifetime and colour points may be used, provided the relative characteristics of the various materials used is such that those materials used for the high lifetime sub-pixels are of higher lifetime but lesser colour point than the materials used for the good colour sub-pixels. In other words, the materials used for the high lifetime sub-pixels may be, in absolute terms, "lower performing", i.e. of lower lifetime than materials generally classified as high lifetime materials. Likewise, the materials used for the good colour point sub-pixels may be, in absolute terms, "lower performing", i.e. have less good colour points than materials generally classified as good colour materials. Nevertheless the use of such EL materials in combination according to the present invention provides benefits, at least to some extent, of improving colour rendition with reduced degradation of lifetime characteristics, compared to using these "lower performing" materials in a conventional sub-pixel arrangement. Such lower performing EL materials may be used for commercial reasons, for example because they are relatively economic to produce or use, or may be particularly suitable for processing reasons related to other processing steps to be carried out in the overall device manufacture, and so on.

Examples of EL materials are as follows.

Generally speaking, typical examples of suitable organic electroluminescent materials which can be used for the sub-pixels 1 are known and described, for example in EP-A-O 717446. Conjugated polymer materials as described in WO96/36959 can also be used.

There are also different classes of light-emitting organic low-molecular weight compounds, such as the so-called Spiro compounds available from Covion Organic Semiconductors GmbH (Frankfurt, Germany). Examples are Spiro-6PP and Spiro Octopus, which emit light in the blue region of the spectrum.

CDT-D Red is a red light-emitting polyfluorene available from Cambridge Display Technology Limited (Cambridge, United Kingdom).

Dow-K4 Green is a green light-emitting polyfluorene available from Dow Chemical Company.

Covion Blue is a blue light-emitting poly(9,9'-spiro-bis-fluorene) available from Covion Organic Semiconductors GmbH (Frankfurt, Germany).

Other possible EL materials are described in the article "Materials and Inks for Full Color PLED-Displays", SID Digest 2002, page 780. For example, fluorine-based homopolymers and copolymers from Covion Organic Semiconductors GmbH (Frankfurt, Germany) or from Dow Chemical Company.

Other possible materials are listed as follows:

For Red

Rubrene: 5,6,11,12-tetraphenylnaphthacene;
DCM: 4-(dicyanomethylene)-2-methyl-6-(4-dimethylaminostyryl)-4H-pyran;
DCM2: [2-methyl-6-[2-(2,3,6,7-tetrahydro-1H, 5H-benzo[ij]quinolizin-9-yl) ethenyl]-4H-pyran-4-ylidene]propane-dinitrile; and
Bis(1-phenylisoquinoline)(acetylacetonate)iridium(III)

For Green

Ir(ppy)3;
TAZ: 3-(4-Biphenylyl)-4-phenyl-5-tert-butylphenyl-1,2,4-triazole

For Blue

DPVBi: 4-4'-Bis(2,2-diphenyl-ethen-1-yl)-diphenyl
The listed materials may require to be suspended in a host matrix. The following materials may be used as a host matrix:
TCTA;
TCB (Tris-Carbazol): 4,4',4"-Tris(carbazol-9-yl)triphenylamine
BCB (Bis-Carbazol): 4,4'-Bis(Carbazol-9-yl)-biphenyl
Further EL materials are described in the article "Electrophosphorescent p-i-n Organic Light-Emitting Devices for Very-High-Efficiency Flat-Panel Displays", Adv. Mater. 14, 22 (2002) 1633.

In the above description, three specific examples of operating schemes are described. In other embodiments, other schemes may be employed. One possibility applies to any operating scheme in which the different types of sub-pixels are driven in an additive sense as discussed above. Such operating schemes may be adapted such that for a colour or colour hue to be displayed that is very saturated (i.e. has a saturation value determined as being above a predetermined colour saturation value), the high lifetime EL material sub-pixels are not driven, or are a driven at lower levels than for less saturated colours. This allows a greater contribution to be made by the good colour EL material sub-pixels for this saturated colour compared to a less-saturated colour (where both these are outside the "first triangle").

In the above embodiments, the three differently coloured sub-pixels 1 of the high lifetime EL material are arranged in a first row; and the three differently coloured sub-pixels 1 of the good colour EL material are arranged in a second row directly under the first row, in a corresponding colour order, i.e. from left to right as seen in FIG. 3. Thus for each respective main colour (red, green, blue), the high lifetime EL material sub-pixel (e.g. $R_L$) and the corresponding good colour EL material sub-pixel (e.g. $R_C$) share a column conductor 6 but use different row address conductors 4. Accordingly, the high lifetime EL material sub-pixel (e.g. $R_L$) and the corresponding good colour EL material sub-pixel (e.g. $R_C$) are addressed one after the other.

However, in other embodiments, the sub-pixels may be arranged in any other implementable way in terms of row and column layout.

For example, for each respective main colour (red, green, blue), the high lifetime EL material sub-pixel (e.g. $R_L$) and the corresponding good colour EL material sub-pixel (e.g. $R_C$) may share a row conductor 4 but use different data conductors 6. In this case, the high lifetime EL material sub-pixel (e.g. $R_L$) and the corresponding good colour EL material sub-pixel (e.g. $R_C$) are addressed at the same time.

In another example, for each respective main colour (red, green, blue), the high lifetime EL material sub-pixel (e.g. $R_L$) and the corresponding good colour EL material sub-pixel (e.g. $R_C$) may share a row conductor 4 and a data conductor 6. In this case, additional pixel electronics is provided at each pixel to separate the display data for the two-sub-pixels of the colour.

In the above embodiments, a high lifetime EL material sub-pixel and a corresponding good colour EL material sub-pixel is provided for each respective main colour (in the above embodiments, red, green, blue). However, in other embodiments, this need not be the case, and instead only one, or only some, of the different main colours (e.g. only blue, say, out of red, blue and green; or in another example, only green and blue, say, out of red, green and blue) are provided with a high lifetime EL material sub-pixel and a corresponding good colour EL material sub-pixel, with the other colour(s) having only one sub-pixel within the pixel.

Embodiments where only blue, out of red, blue and green, is provided with a high lifetime EL material sub-pixel and a corresponding good colour EL material sub-pixel are particularly advantageous, as the tendency for more saturated colour material to have shorter lifetime is most significant in EL materials for blue sub-pixels.

Figure 5:
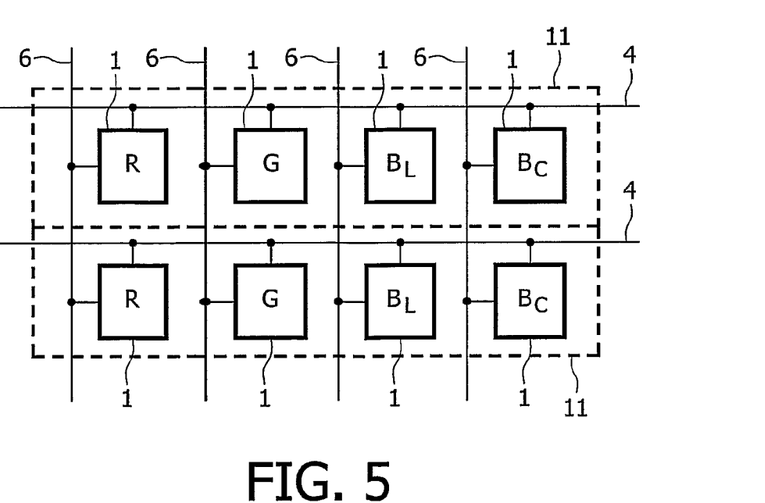
FIG. 5 is a schematic illustration showing further details of two pixels of another display device.

One such embodiment will now be described in more detail with reference to FIG. 5. FIG. 5 is a schematic illustration showing further details of two pixels 11 in this embodiment. In this embodiment, three main colours of sub-pixels are provided, i.e. red, green and blue, indicated respectively as R, G and B in FIG. 3. In each pixel, there is only one red sub-pixel R and only one green sub-pixel G. However, in each pixel 11 there are two blue sub-pixels, formed from different EL materials. In more detail, one of the two blue sub-pixels $B_L$ of each pixel 11 is formed from a high lifetime EL material, whereas the other of the two blue sub-pixels $B_C$ is formed from a good colour EL material.

In this embodiment, the four sub-pixels R, G, $B_L$, $B_C$ of each pixel 11 are arranged in the same row. This arrangement enables each sub-pixel 1 to be driven independently.

In operation, when blue is required to contribute to a colour to be displayed by a pixel 11, either the high lifetime blue sub-pixel $B_L$, the good colour blue sub-pixel $B_C$, or both, is driven depending on the colour to be displayed and the choice of operating scheme, following the principles explained above for the embodiment shown in FIG. 3, but here only applied to blue as opposed to all three colours.

Figure 6:
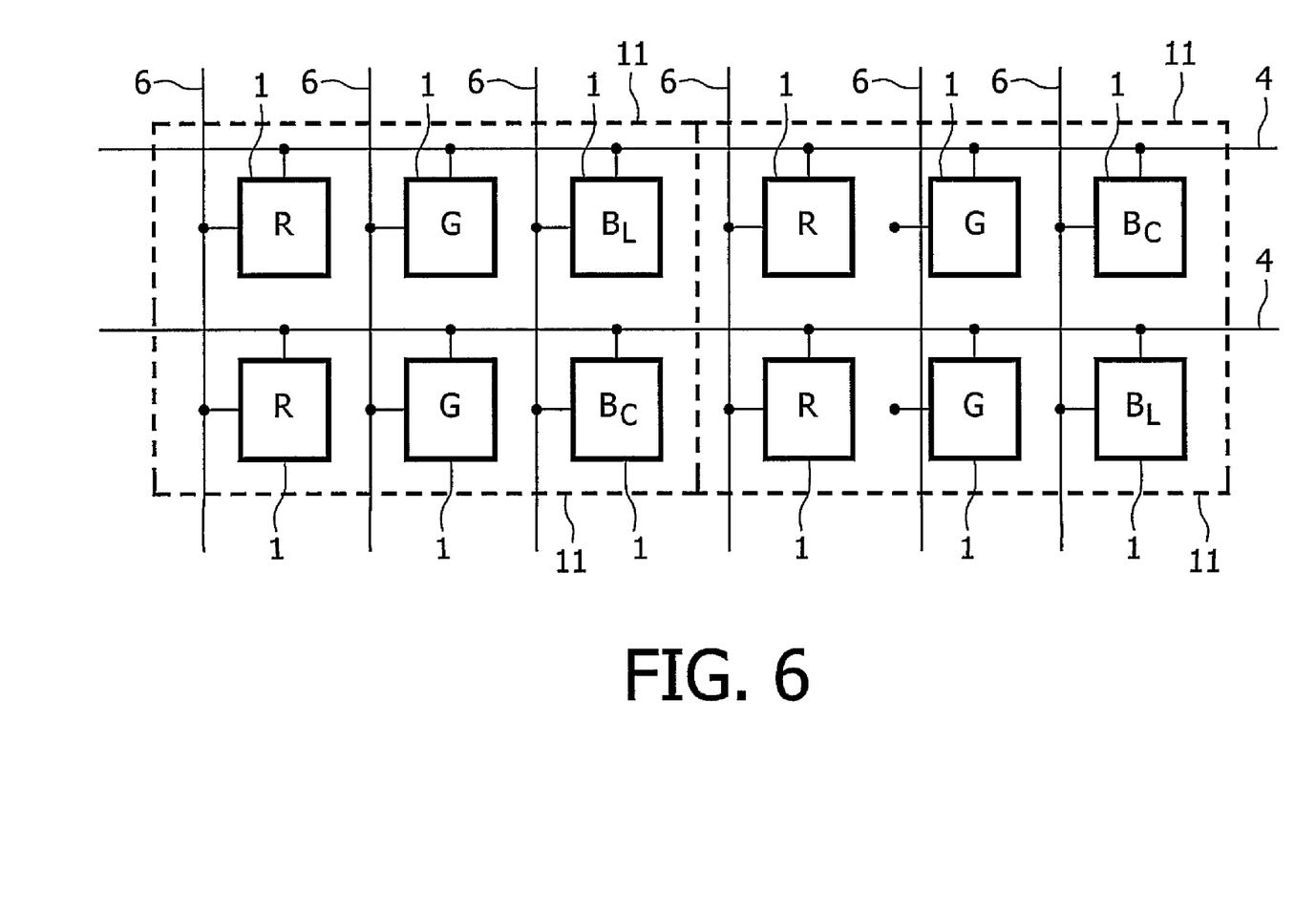
FIG. 6 is a schematic illustration showing further details of four pixels of another display device.

A further embodiment where only blue, out of red, blue and green, is provided with a high lifetime EL material sub-pixel and a corresponding good colour EL material sub-pixel, will now be described with reference to FIG. 6. FIG. 6 is a schematic illustration showing further details of four pixels 11 in this embodiment. In this embodiment, three main colours of sub-pixels are provided, i.e. red, green and blue, indicated respectively as R, G and B in FIG. 3. There is only one type of red sub-pixel R, and only one type of green sub-pixel G. However, there are two types of blue sub-pixels, formed from different EL materials. In more detail, one of the two types of blue sub-pixels $B_L$ are formed from a high lifetime EL material, whereas the other of the two types of blue sub-pixels $B_C$ are formed from a good colour EL material. The respective types of blue sub-pixels are provided in alternate pixels 1. Thus, in this embodiment, each pixel 1 comprises only one blue sub-pixel; however the pixels 11 as a whole comprise two types of blue sub-pixels.

In operation, when blue is required to contribute to a colour to be displayed by a group of adjoining pixels 11, the presence of some pixels with good colour blue sub-pixels $B_C$ will tend to make an improved contribution to colour renditioning, and the presence of some high lifetime blue sub-pixels $B_L$ will tend provide some improved lifetime behaviour.

In the embodiments described above where only one, or only some, of the different main colours are provided with a high lifetime EL material sub-pixel and a corresponding good colour EL material sub-pixel, the single sub-pixel for the other main colour(s) may be provided in either the form of a relatively high lifetime EL material sub-pixel, a relatively good colour EL material sub-pixel, or a sub-pixel made of a an EL material providing intermediate relative levels of lifetime and colour property.

More generally, it will be appreciated that main sub-pixel colours other than red/green/blue may be provided, including cases where there are less or more than three main colours of sub-pixel per pixel. In each case, all the various details described above for the various embodiments may be modified as required or allowed by such different numbers and choices of colour sub-pixels, including for example the above possibilities for row/column arrangement, operating schemes, colour combinations and so on.

In the above embodiments, the drive circuitry is as described with reference to FIGS. 1 and 2. However, in other embodiments, any other appropriate drive circuitry may be used. Moreover, even in the case of use of the circuitry as shown in FIGS. 2 and 3, other driving processes may be used. For example, the drive circuitry shown in FIG. 2 may be driven in digital mode as described in US2003/0098828A1.

In the above embodiments all the different sub-pixels 1 within a pixel 11 have substantially the same display area or aperture. However, in other embodiments, different sub-pixels may be of different sizes.

The invention claimed is:

1. A color electroluminescent (EL) display device comprising:
   an array of pixels;
   wherein each pixel comprises two separate sub-pixels for each color of two or more main colors,
   a first separate sub-pixel comprising a first EL material and a second separate sub-pixel having the same color as the first separate sub-pixel comprising a second EL material;
   wherein the first EL material is of a higher lifetime than the second EL material,
   the second EL material has a higher color point and/or higher color rendition properties than the first EL material; and
   wherein the sub-pixels of the two or more main colors of the first EL material are arranged in a first row, and the sub pixels of the two or more main colors of the second EL material are arranged in a second row directly under the first row forming columns, wherein sub-pixels of a same main color are in a same column;
   wherein the display device further comprises circuitry arranged to drive the display device such that when a color or color hue to be displayed by the pixel can be provided with a predetermined color contribution of the main color of the first and second sub-pixels by driving the first sub-pixel without driving the second sub-pixel, then the first sub-pixel is driven but not the second sub-pixel: and wherein the circuitry is further arranged such that when the color or color hue to be displayed cannot be provided with a predetermined color contribution of the main color of the first and second sub-pixels by driving the first sub-pixel without driving the second sub-pixel then the second sub-pixel is driven.

2. A display device according to claim 1, wherein the driving circuitry is arranged such that, when the color or color hue to be displayed cannot be provided with a predetermined color contribution of the main color of the first and second sub-pixels by driving the first sub-pixel without driving the second sub-pixel, then the second sub-pixel is driven in addition to driving the first sub-pixel.

3. A display device according to claim 1, wherein the driving circuitry is arranged such that, when the color or color hue to be displayed cannot be provided with a predetermined color contribution of the main color of the first and second sub-pixels by driving the first sub-pixel without driving the second sub-pixel, then the second sub-pixel is driven instead of driving the first sub-pixel.

4. A display device according to claim 1, wherein, for each of the main colors, the pixels comprise first sub-pixels of the main color comprising a first EL material and second sub-pixels of the main color comprising a second EL material;
   the first EL material is of a higher lifetime than the second EL material; and
   the second EL material has a higher color point and/or higher color rendition properties than the first EL material.

5. A display device according to claim 1, wherein, for only the main color blue, the pixels comprise first blue sub-pixels comprising a first EL material and second blue sub-pixels comprising a second EL material;
   the first EL material is of a higher lifetime than the second EL material; and
   the second EL material has a higher color point and/or higher color rendition properties than the first EL material.

6. A display device according to claim 5,
   wherein some of the pixels comprise a said first blue sub-pixel and not a said second blue sub-pixel; and the remaining pixels comprise a said second blue sub-pixel and not a said first blue sub-pixel.

7. A display device according to claim 1, wherein the main colors are red, green and blue.

8. A display device according to claim 1, wherein the color of any pixel of the second sub-pixels is the same color as a pixel in the first sub-pixels.

9. A method of driving a color electroluminescent, EL, display device, comprising:
   determining whether a predetermined color contribution to a color hue to be displayed can be provided by a first sub-pixel of a pair of color sub-pixels of a same color in a pixel, wherein the first sub-pixel of the pair comprises a first EL material and the second sub-pixel of the pair comprises a second EL material, the first EL material being of a higher lifetime than the second EL material, and the second EL material having higher color points and/or higher color rendition properties than the first EL material, wherein the first sub-pixel of the first EL material is arranged in a first row, and the second sub pixel of the second EL material is arranged in a second row directly under the first row, thereby forming a column of the same color;
   if a predetermined color contribution can be provided, driving the first sub-pixel but not the second sub-pixel; and
   if a predetermined color contribution cannot be provided, driving the second sub-pixel.

10. A method according to claim 9, wherein, if a predetermined color cannot be provided, the step of driving the second sub-pixel is performed in addition to driving the first sub-pixel such that both the first and second sub-pixel make a color contribution to the color hue to be displayed.

11. A method according to claim 9, wherein, if a predetermined color cannot be provided, the step of driving the second sub-pixel is performed instead of driving the first sub-pixel such that the second sub-pixel makes a color contribution to the color hue to be displayed but the first sub-pixel does not make a contribution to the color hue to be displayed.

12. A driver for a color electroluminescent (EL) display device, comprising:
   a means for determining whether a predetermined color contribution to a color hue to be displayed can be provided by a first sub-pixel of a pair of color sub-pixels of a same color in a pixel, wherein the first sub-pixel of the pair comprises a first EL material and the second sub-pixel of the pair comprises a second EL material, the first EL material being of a higher lifetime than the second EL material, and the second EL material having higher color points and/or higher color rendition properties than the first EL material, wherein the first sub-pixel of the first EL material is arranged in a first row, and the second sub pixel of the second EL material is arranged in a second row directly under the first row, thereby forming a column of the same color;
   a means for driving the first sub-pixel but not the second sub-pixel when a predetermined color contribution can be provided by the first sub-pixel of a pair of color sub-pixels of a same color, and
   a means for driving the second sub-pixel when a predetermined color contribution cannot be provided.

* * * * *